(12) United States Patent
Alaan et al.

(10) Patent No.: US 12,328,946 B2
(45) Date of Patent: Jun. 10, 2025

(54) ESD PROTECTION DECOUPLED FROM DIFFUSION

(71) Applicant: Intel Corporation, Santa Clara, CA (US)

(72) Inventors: Urusa Alaan, Hillsboro, OR (US); Abhishek A. Sharma, Portland, OR (US); Charles C. Kuo, Union City, CA (US); Benjamin Orr, Portland, OR (US); Nicholas Thomson, Hillsboro, OR (US); Ayan Kar, Portland, OR (US); Arnab Sen Gupta, Hillsboro, OR (US); Kaan Oguz, Beaverton, OR (US); Brian S. Doyle, Portland, OR (US); Prashant Majhi, San Jose, CA (US); Van H. Le, Portland, OR (US); Elijah V. Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 993 days.

(21) Appl. No.: 17/133,595

(22) Filed: Dec. 23, 2020

(65) Prior Publication Data
US 2022/0199609 A1    Jun. 23, 2022

(51) Int. Cl.
*H02H 9/04*     (2006.01)
*H10D 89/60*    (2025.01)

(52) U.S. Cl.
CPC ............ *H10D 89/60* (2025.01); *H02H 9/046* (2013.01)

(58) Field of Classification Search
CPC .. H01L 27/0248; H01L 27/0255; H02H 9/046
See application file for complete search history.

(56) References Cited

U.S. PATENT DOCUMENTS

| | | |
|---|---|---|
| 9,397,084 B1 | 7/2016 | Li |
| 2016/0240527 A1* | 8/2016 | Ramachandran ... H01L 27/0688 |
| 2019/0304963 A1* | 10/2019 | Majhi ................. H01L 27/0255 |

(Continued)

FOREIGN PATENT DOCUMENTS

WO    WO-2018190881 A1 *  10/2018

OTHER PUBLICATIONS

Faber Hendrik et al: "Adding a new layer 1-15 to 'more than Moore'", Nature Electronics, [Online] vol. 2, No. 11, Nov. 1, 2019 (Nov. 1, 2019), pp. 497-498, XP055891308, DOI: 10.1038/s41928-019-0329-8 Retrieved from the Internet: URL:http://www.nature.com/articles/s41928-019-0329-8>.

(Continued)

*Primary Examiner* — Gary A Nash
(74) *Attorney, Agent, or Firm* — Schwabe, Williamson & Wyatt P.C.

(57) ABSTRACT

Embodiments disclosed herein include semiconductor devices with electrostatic discharge (ESD) protection of the transistor devices. In an embodiment, a semiconductor device comprises a semiconductor substrate, where a transistor device is provided on the semiconductor substrate. In an embodiment, the semiconductor device further comprises a stack of routing layers over the semiconductor substrate, and a diode in the stack of routing layers. In an embodiment, the diode is configured to provide electrostatic discharge (ESD) protection to the transistor device.

17 Claims, 9 Drawing Sheets

(56) References Cited

U.S. PATENT DOCUMENTS

2021/0183850 A1* 6/2021 Nidhi ..................... H01L 29/16

OTHER PUBLICATIONS

Zhou Xianda et al: "Low-Temperature-Processed Power Schottky Diode Based on Amorphous Indium-Tin-Zinc-Oxide/Indium-Gallium-ZincOxide Bilayer", IEEE Transactions on Electron Devices, IEEE, USA, vol. 66, No. 11, Nov. 1, 2019 (Nov. 1, 2019), pp. 4759-4763, XP011755526, ISSN: 0018-9383, DOI: 10.1109/TED.2019. 2940720.
Search Report from European Patent Application No. 21195027.4, mailed Feb. 25, 2022,, 10 pgs.

* cited by examiner

ESD PROTECTION DECOUPLED FROM DIFFUSION

TECHNICAL FIELD

Embodiments of the disclosure are in the field of semiconductor structures and processing and, in particular, to electrostatic discharge (ESD) diodes provided in the backend of a semiconductor device.

BACKGROUND

Electrostatic discharge (ESD) protection is necessary to protect transistor devices. Typically, the ESD protection is provided by a diode. In many instances, the diode is manufactured on the semiconductor substrate adjacent to the transistor or transistors that are being protected. In the case of non-planar transistors, such as tri-gate devices (e.g., fin-FET devices), a semiconductor fin will be used to provide the ESD diode instead of populating the fin as a functional device. Such architectures are feasible since the base structure of the ESD diode and the transistor are the same. That is, the base structures for both are fins.

However, in the case of gate-all-around (GAA) devices, the fins are formed of alternating layers of a sacrificial layer and a device layer. The sacrificial layers are removed to leave behind nanowires or nanoribbons. That is, there is no residual fin on which to form the ESD diode. As such, current processing may include etching out the entire GAA fin, and growing a silicon fin in its place. The silicon fin then must go through all of the GAA processing, which is optimized for the GAA fin. This leads to a loss of control and optimization of the diode from an integration perspective.

DESCRIPTION OF THE EMBODIMENTS

Figure 1:
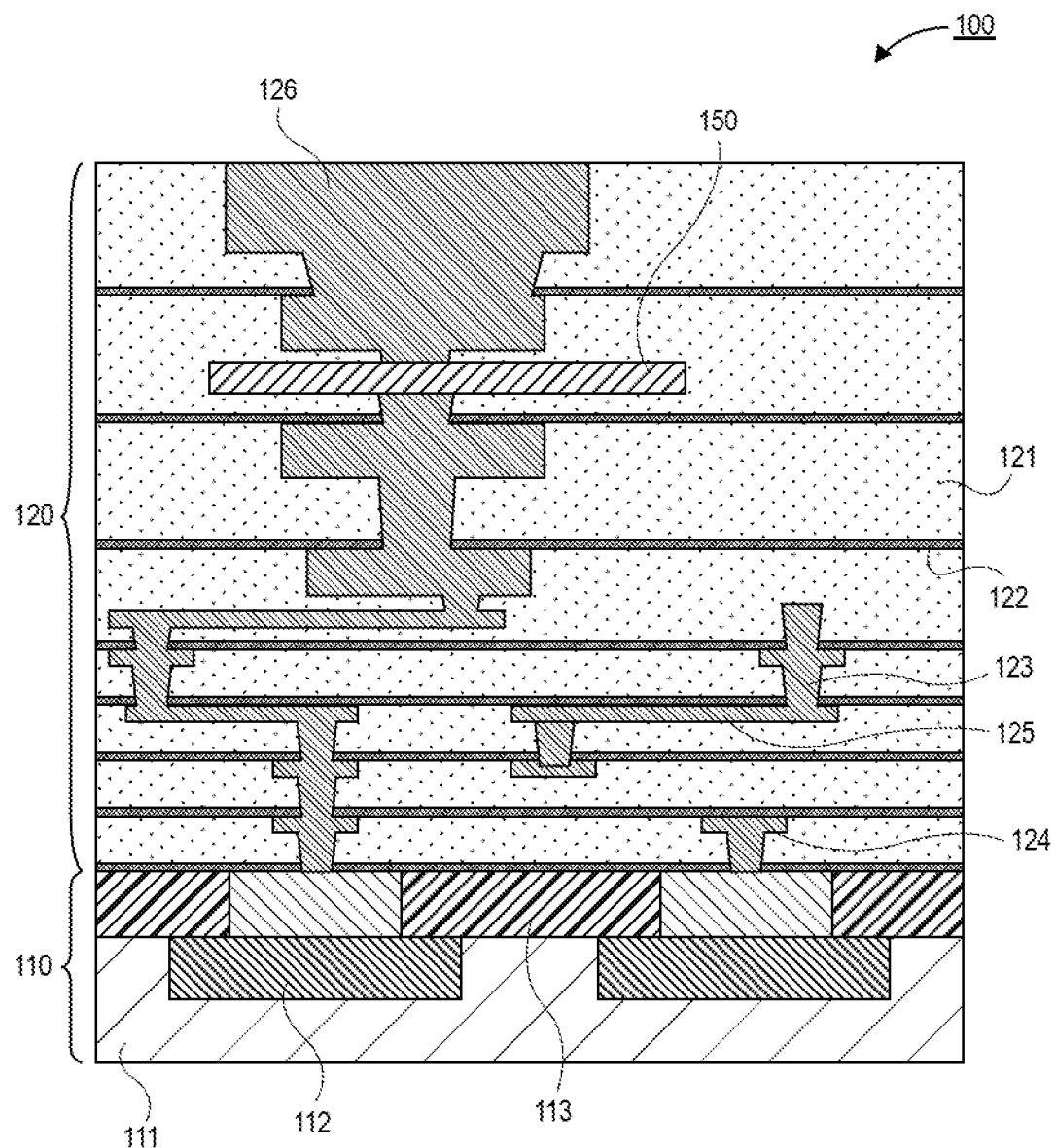
FIG. 1 is a cross-sectional illustration of a semiconductor device with an electrostatic discharge (ESD) diode in the back end of line (BEOL) stack, in accordance with an embodiment.

Embodiments described herein comprise electrostatic discharge (ESD) diodes provided in the backend of a semiconductor device. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, electrostatic discharge (ESD) diodes for non-planar transistor devices are commonly formed on the semiconductor substrate, adjacent to the transistors that they are protecting. However, with the advance to gate-all-around (GAA) architectures, the fins on which the ESD diodes are typically formed are absent, and the fins need to be grown after removal of the GAA fin stack. Furthermore, the processing operations used to fabricate the GAA transistors are not optimized for the presence of the ESD fin, which leads to a loss of control and optimization of the ESD diode.

Accordingly, embodiments disclosed herein include an ESD diode that is decoupled from the semiconductor layer. Instead the ESD diode is fabricated in the back end of line (BEOL) stack. Moving the ESD diode to the BEOL stack provides several benefits. One such benefit is that more area on the semiconductor layer is freed up for use as transistor devices. Additionally, moving the ESD diode to the BEOL stack allows for the processing of the ESD diode to be optimized without needing to account for the various processing operations needed to form the transistor devices.

While GAA transistor architectures are benefited by such ESD diode schemes, it is to be appreciated that embodiments may include ESD diodes with any transistor architecture. For example, fin-FET devices may also be used as the transistor below the ESD diode. In the case of fin-FET devices, removing the ESD diode from the front end frees up additional space that can be used for transistors instead of being used for ESD protection. As such an area savings is provided on the wafer. Furthermore, it is to be appreciated that ESD diodes disclosed herein are beneficial for any die architecture that incorporates backside processing (e.g., integration schemes with interconnects under, as well as on top of, the transistors).

Referring now to FIG. 1, a cross-sectional illustration of a semiconductor device 100 is shown, in accordance with an embodiment. In an embodiment, the semiconductor device 100 comprises a front end portion 110 and a BEOL portion 120. The front end portion 110 may comprise a semiconductor layer 111. The semiconductor layer 111 may have doped regions 112. The semiconductor devices (e.g., non-planar transistor devices) may be fabricated in the doped regions 112 of the semiconductor layer 111. An example of a particular non-planar transistor is described in greater detail below. In an embodiment, a first interconnect layer 113 is provided over the semiconductor layer 111.

In the BEOL portion 120, a plurality of dielectric layers 121 are arranged in a stack. The dielectric layers 121 may be separated from each other by an etchstop layer 122 or the like. In an embodiment, conductive routing is provided in the dielectric layers 121. For example, the conductive routing comprises vias 123, pads 124, and traces 125. In an embodiment, the ESD diode 150 is provided in the BEOL portion 120. That is, the ESD diode 150 is provided in a layer (or layers) above the transistor devices. In the particular embodiment shown in FIG. 1, the ESD diode 150 is provided closer to the first level interconnect (FLI) pad 126 than to the transistor devices in the doped regions 112. A more detailed description of the ESD diodes 150 is provided below.

Figure 2:
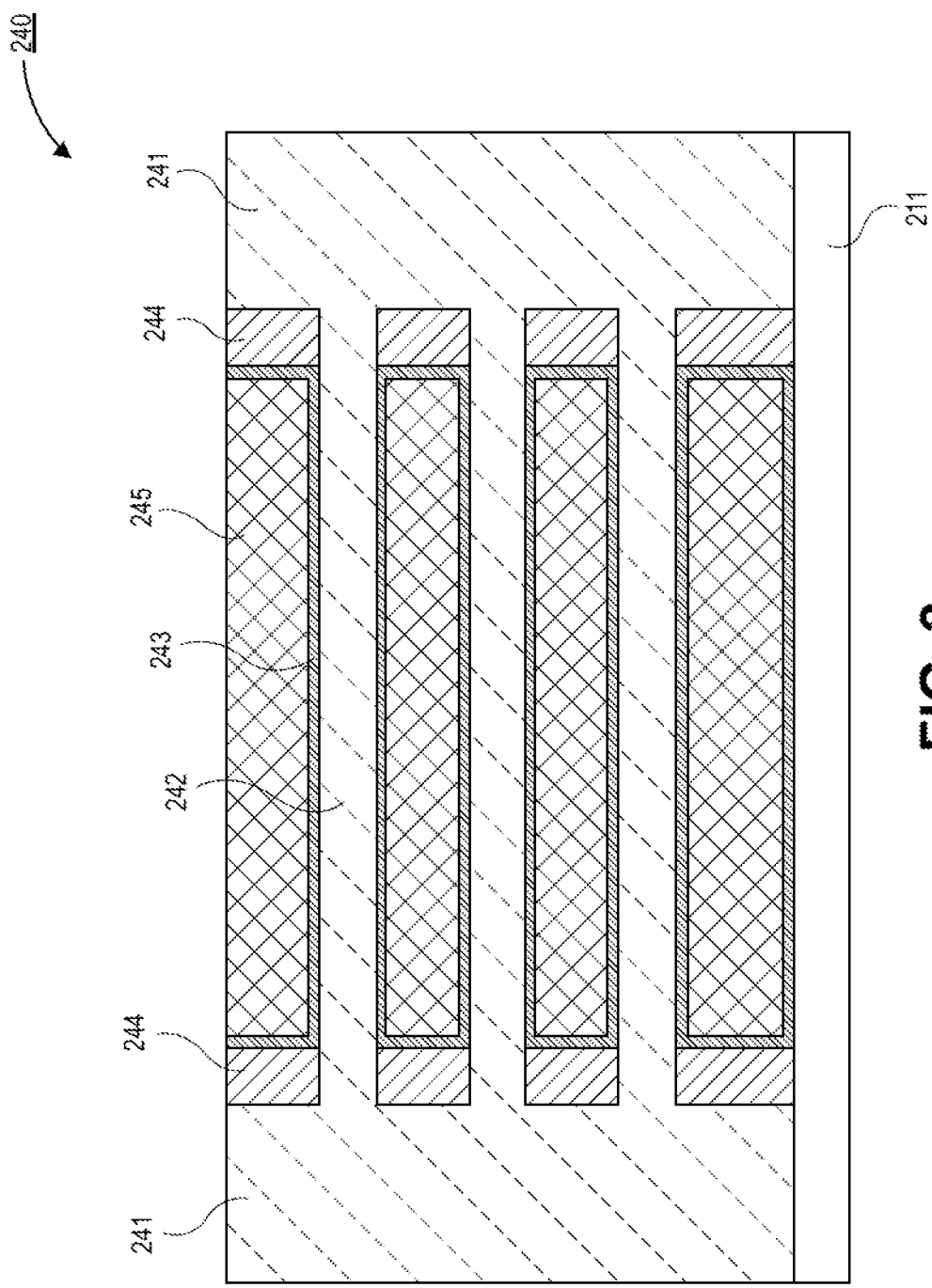
FIG. 2 is a cross-sectional illustration of a gate-all-around (GAA) transistor device that is protected by an ESD diode in the BEOL stack, in accordance with an embodiment.

Referring now to FIG. 2, a cross-sectional illustration of a transistor 240 is shown, in accordance with an embodiment. In an embodiment, the transistor 240 may be fabricated on a semiconductor substrate 211. The transistor comprises source/drain regions 241. The source/drain regions 241 are separated from each other by nanowires (or nanoribbons) 242 that pass through spacers 243. The nanowires 242 are surrounded by a gate dielectric 244. The gate dielectric wraps around an entire perimeter of the nanowires 242 (i.e., into and out of the plane of FIG. 2). Similarly, the gate electrode 245 wraps around the entire perimeter of the nanowires 242 to provide the GAA control of the nanowire channel. While shown as a single material layer, it is to be appreciated that the gate electrode 245 may comprise a workfunction metal and a fill metal.

As noted above, the use of GAA architectures results in the absence of fins that can be used for the ESD diode. Instead of growing fins specifically for the ESD diode, embodiments disclosed herein include moving the ESD diode to the BEOL stack (not visible in FIG. 2) above the transistor 240. As such, more room is provided on the semiconductor substrate 211 for transistors 240 and the manufacturing processes for the transistor 240 and the ESD diode can be decoupled from each other. As such, both the ESD diode and the transistor can be optimized independently. While the transistor 240 is shown as a GAA transistor, it is to be appreciated that embodiments may include ESD diodes with any transistor architecture. For example, fin-FET devices may also be used as the transistor below the ESD diode. In the case of fin-FET devices, removing the ESD diode from the front end frees up additional space that can be used for transistors instead of being used for ESD protection. As such an area savings is provided on the wafer. Furthermore, it is to be appreciated that ESD diodes disclosed herein are beneficial for any die architecture that incorporates backside processing (e.g., integration schemes with interconnects under, as well as on top of, the transistors).

Figure 3A:
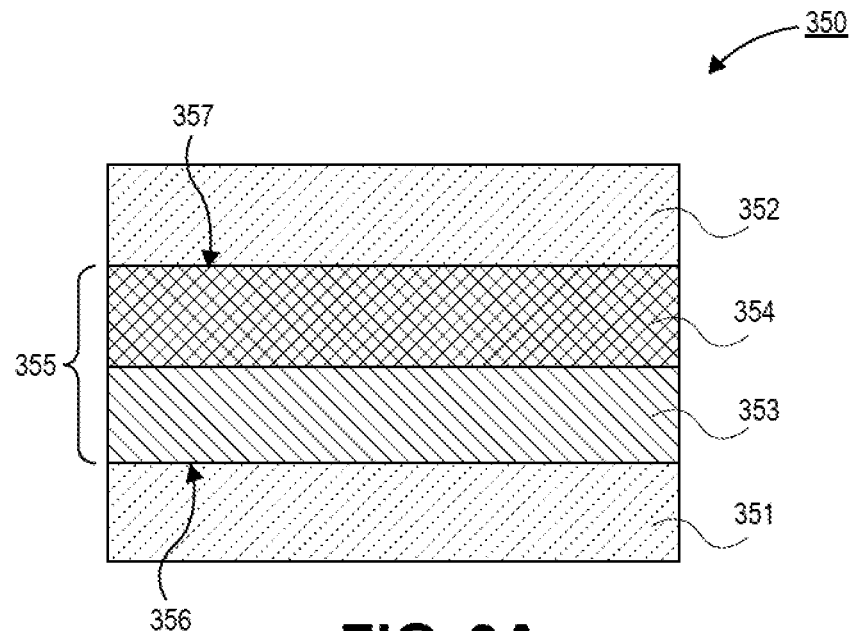
FIG. 3A is a cross-sectional illustration of an ESD diode with a bilayer semiconductor region, in accordance with an embodiment.

Referring now to FIG. 3A, a cross-sectional illustration of an ESD diode 350 is shown, in accordance with an embodiment. In an embodiment, the diode 350 may comprise a first electrode 351 and a second electrode 352. In some embodiments, the first electrode 351 and the second electrode 352 comprise the same material. For example, the first electrode 351 and the second electrode 352 may comprise copper. In an embodiment, a semiconductor region 355 is provided between the first electrode 351 and the second electrode 352. The semiconductor region 355 may comprise a bilayer architecture. That is, a first layer 353 may have a first interface 356 with the first electrode 351, and a second layer 354 may have a second interface 357 with the second electrode 352. In an embodiment, the first layer 353 is chosen so that a Schottky contact is provided at the first interface 356, and the second layer 354 is chosen so that an ohmic contact is provided at the second interface 357. In other embodiments, the entire diode may be rotated 90° for a vertical architecture. In either the horizontal or vertical embodiment, the diode may be corrugated or fully planar. The advantage of vertical and corrugated embodiments is the ability to effectively have large diodes without an area penalty when very high ESD charges need to be accommodated.

Figure 3B:
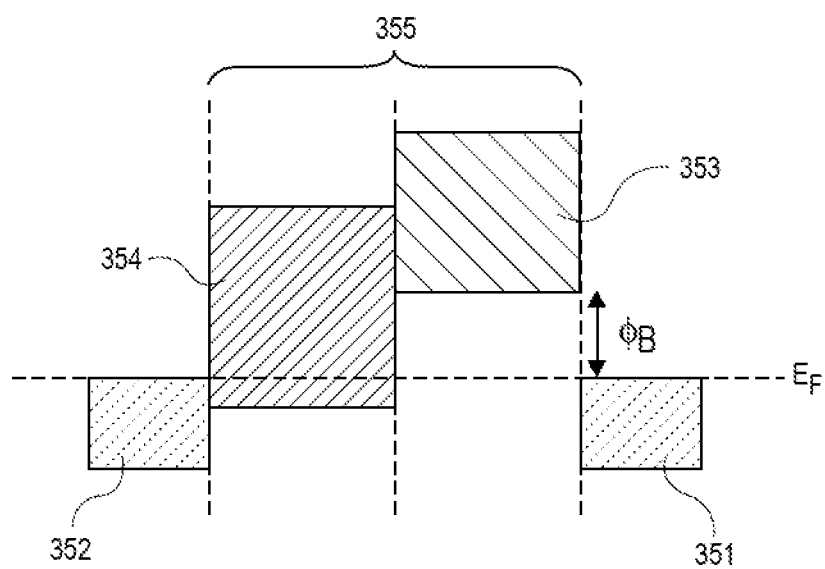
FIG. 3B is a band diagram of the ESD diode in FIG. 3A, in accordance with an embodiment.

Referring now to FIG. 3B, band gap diagram of the diode 350 is shown, in accordance with an embodiment. As shown, the first semiconductor material 353 has a band-gap $\phi_B$ with the first electrode 351. As such, a Schottky contact is provided where the first semiconductor material 353 interfaces with the first electrode 351. At the interface between the second semiconductor material 354 and the second electrode 352, an ohmic connection is provided since the band of the second semiconductor material 354 overlaps the second electrode 352. It is to be appreciated that engineering the material of the semiconductor region 355, as opposed to the electrodes 351/352, allows for more Schottky-like behavior of the diode (e.g., faster switching and lower reverse-bias leakage).

Those skilled in the art will appreciate that, when dealing with BEOL material constraints, the selection of the semiconductor materials for the diode may be more limited than what is available in front end of line processing. Additionally, the material selection is limited by the necessary band offsets. However, oxide semiconductors are strong candidates for such Schottky diode applications due to the wide variety in properties, because they are easily engineered, and often are BEOL compatible. Specific embodiments may include the use of covalently, ionically and van der Waals bonded material systems. A few examples include amorphous Si, amorphous Ge, polysilicon, poly-SiGe, poly-Ge, poly-InGaAs, poly-GaN, $MoS_2$, $WSe_2$, and black phosphorus. Doped and undoped varieties of many oxide systems can also be used, for example: copper oxide, indium tin oxide, indium zinc oxide, indium aluminum oxide, indium tungsten oxide, indium hafnium oxide, indium magnesium oxide, zinc oxide, doped and undoped indium oxide, indium silicon oxide, indium gallium zinc oxide (with percentage of $InO_x$ from 1% to 95%, $ZnO_x$ from 1% to 95% and $Ga_2O_3$ from 1% to 95% making a combination totaling 100%), $InTiO_x$, $TiO_x$, $SnO_x$, $InSb_x$, $CuSnO_x$, etc. and variants thereof. Several oxide, chalcogenide, and 2D systems are BEOL compatible with a high band gaps (and thus low leakage). In a particular embodiment, the first layer 353 comprises an insulating oxide material such as one in the list above, and the second layer 354 comprises a conducting oxide such as $In_2O_3$ or Sn or Ru-based oxides. It is to be appreciated with this scheme that many other material systems can be used to form both the ohmic contact and the Schottky contact. It is also to be appreciated that the interface between the first layer 353 and the second layer 354 may lead to a conduction barrier. In some embodiments, the conduction barrier may be leveraged in order to reduce reverse bias leakage. However, the barrier may also result in a detrimental impact of forward bias.

One solution for reducing the detrimental impact to forward bias resulting from the interface between the first semiconductor layer 353 and the second semiconductor layer 354 is to provide a semiconductor region with a single layer that comprises a compositional gradient. An example of such an embodiment is shown in FIG. 4.

Figure 4:
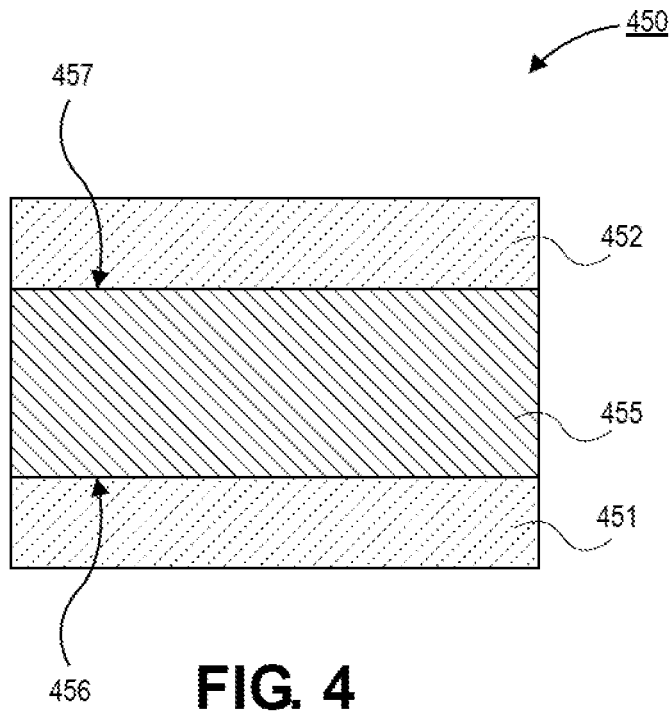
FIG. 4 is a cross-sectional illustration of an ESD diode with a semiconductor region with a graded composition, in accordance with an embodiment.

Referring now to FIG. 4, a cross-sectional illustration of a diode 450 is shown, in accordance with an embodiment. As shown, a semiconductor region 455 with a single layer is provided between the first electrode 451 and the second electrode 452. While shown as a single layer, it is to be appreciated that the semiconductor region 455 may comprise a compositional gradient through its thickness. For example, a composition at the first interface 456 may be engineered to provide a Schottky contact through use of a more insulating material, and a composition at the second interface 457 may be engineered to provide an ohmic contact through selection of more metallic material. In a particular embodiment, the semiconductor region 455 at the first interface 456 may comprise an insulator such as gallium zinc oxide, and the semiconductor region 455 at the second interface 457 may comprise the more conducting $In_2O_3$. In an embodiment, the compositional gradient may be formed using binary oxide targets in a physical vapor deposition (PVD) process to grow the semiconductor region 455 such that the defects of interest accumulate on one side of the semiconductor region 455. Various growth and layer transfer techniques can achieve the same phenomena.

In addition to a binary oxide target PVD process, embodiments include several other methods of forming a compositional gradient in the semiconductor region 455. For example, an implantation process and/or a sacrificial layer with a diffusion process may be used. Examples of such processes are provided with respect to FIGS. 5A-5C and FIGS. 6A-6E.

Figure 5A:
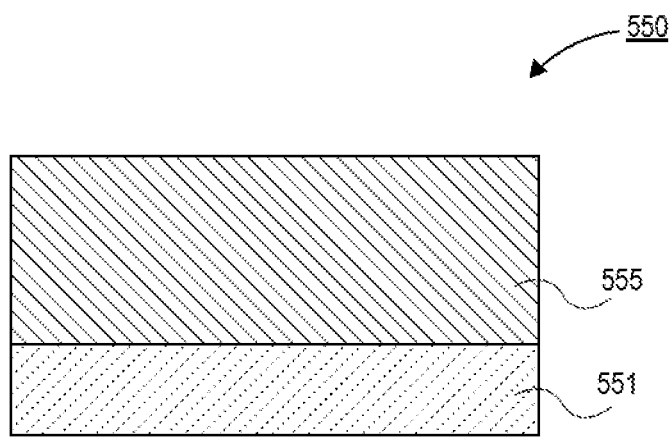
FIGS. 5A-5C are cross-sectional illustrations depicting a process for forming an ESD diode with a semiconductor region with a graded composition, in accordance with an embodiment.

Referring now to FIG. 5A, a cross-sectional illustration of a portion of a diode 550 is shown, in accordance with an embodiment. As shown, the diode 550 may comprise a first electrode 551 and a semiconductor region 555 over the first electrode 551. The semiconductor region 555 may comprise a single material composition. That is, the semiconductor region 555 may comprise a single material composition through its thickness. For example, the semiconductor region 555 may comprise gallium zinc oxide.

Figure 5B:
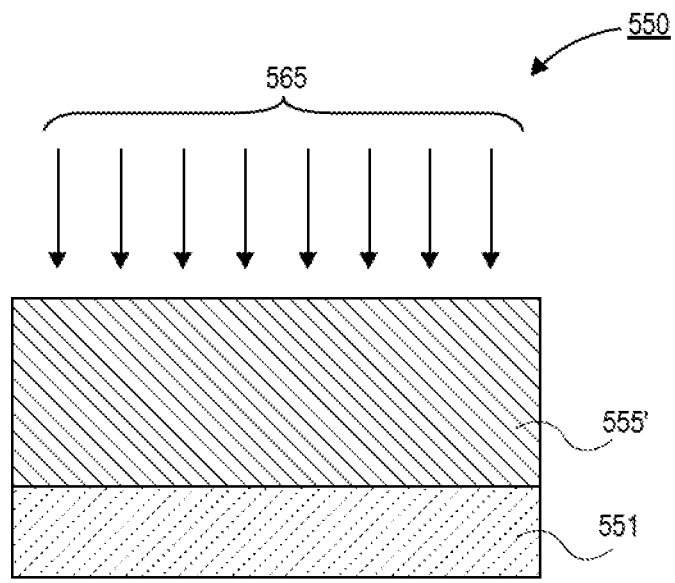

Referring now to FIG. 5B, a cross-sectional illustration of the diode 550 during an implantation process is shown, in accordance with an embodiment. In an embodiment, dopants 565 are implanted into the top surface of the semiconductor region 555 to form implanted semiconductor region 555'. The implant may be done in an ambient environment or with a plasma. The implanted semiconductor region 555' results in a semiconductor with a highly doped top surface. In an embodiment, the dopants may comprise indium, fluorine, or any number of other elements.

Figure 5C:
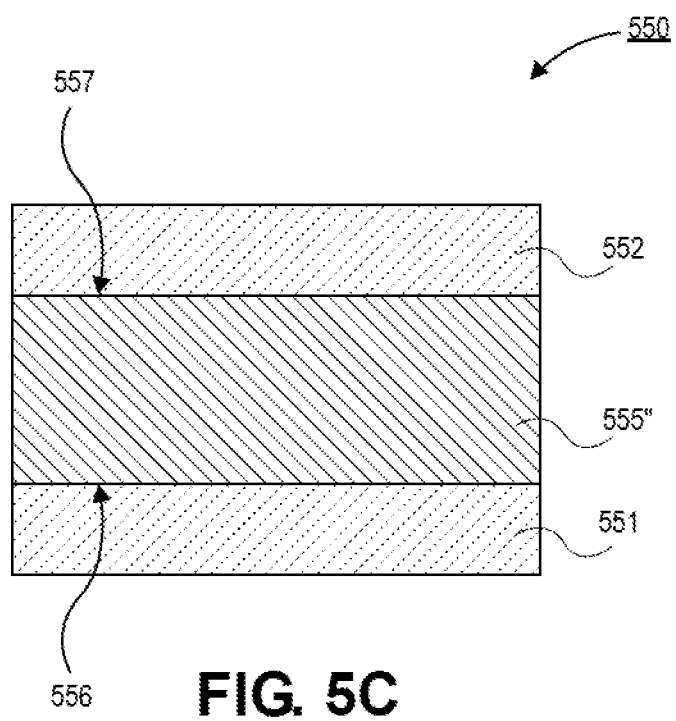

Referring now to FIG. 5C, a cross-sectional illustration of the diode 550 after an annealing process is used to form a compositional gradient semiconductor region 555". The anneal drives diffusion of the dopants through a thickness of the semiconductor region 555" in order to form the compositional gradient. After the annealing process, a second electrode 552 may be disposed over the compositional gradient semiconductor region 555". In an embodiment, the compositional gradient results in a first interface 556 with a Schottky contact, and a second interface 557 with an ohmic contact.

Referring now to FIGS. 6A-6E, a series of cross-sectional illustrations depicting a process for forming a diode with a compositional gradient semiconductor region is shown, in accordance with an additional embodiment.

Figure 6A:
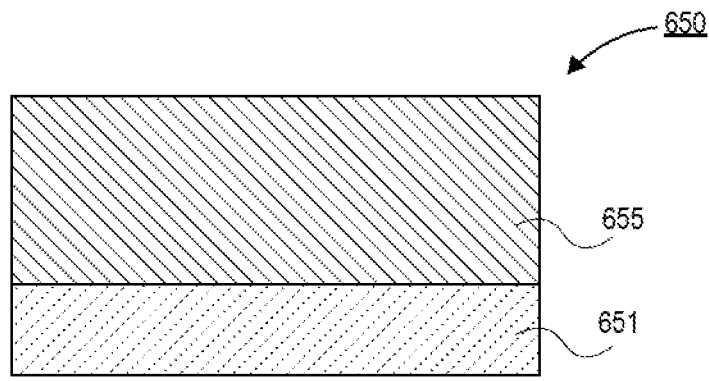
FIGS. 6A-6E are cross-sectional illustrations depicting a process for forming an ESD diode with a semiconductor region with a graded composition, in accordance with an additional embodiment.

Referring now to FIG. 6A, a cross-sectional illustration of a portion of a diode 650 is shown, in accordance with an embodiment. As shown, the diode 650 may comprise a first electrode 651 and a semiconductor region 655 over the first electrode 651. The semiconductor region 655 may comprise a single material composition. That is, the semiconductor region 655 may comprise a single material composition through its thickness. For example, the semiconductor region 655 may comprise indium gallium zinc oxide.

Figure 6B:
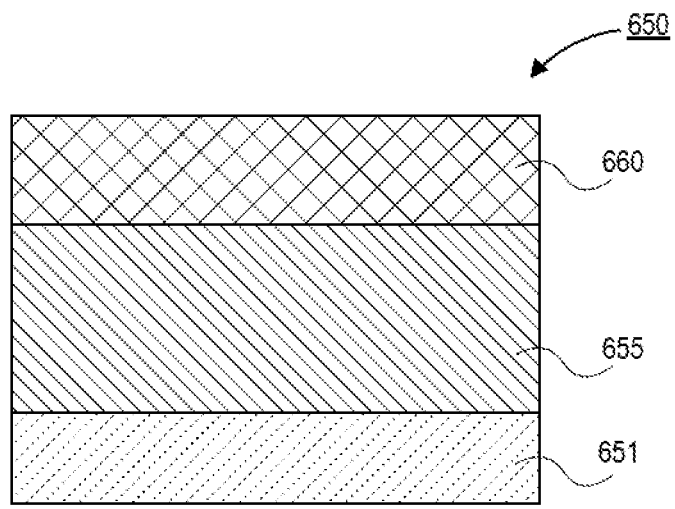

Referring now to FIG. 6B, a cross-sectional illustration of a portion of a diode 650 after a sacrificial layer 660 is disposed over a top surface of the semiconductor region 655 is shown, in accordance with an embodiment. In an embodiment, the sacrificial layer 660 may comprise a metal or various dielectrics suitable for doping the semiconductor regions 655.

Figure 6C:
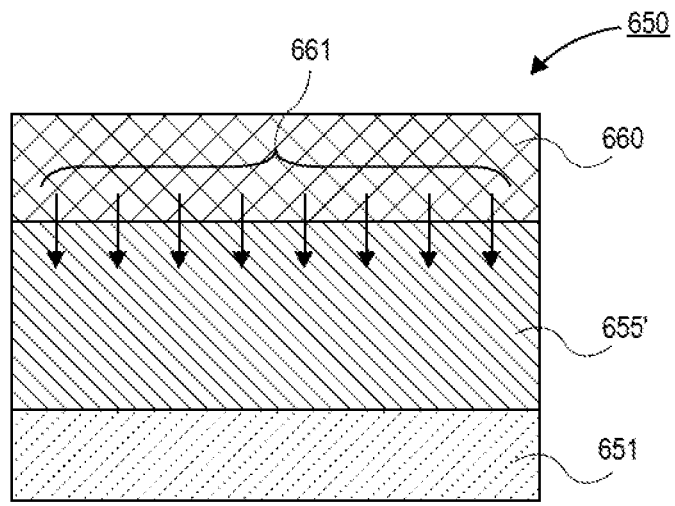

Referring now to FIG. 6C, a cross-sectional illustration of the diode 650 during an annealing process is shown, in accordance with an embodiment. The annealing process may drive diffusion of dopants 661 from the sacrificial layer 660 into the semiconductor region 655 to form a doped semiconductor region 655'. The annealing process results in the top portion of the doped semiconductor region 655' being highly doped and a compositional gradient being formed through a thickness of the doped semiconductor region 655'.

Figure 6D:
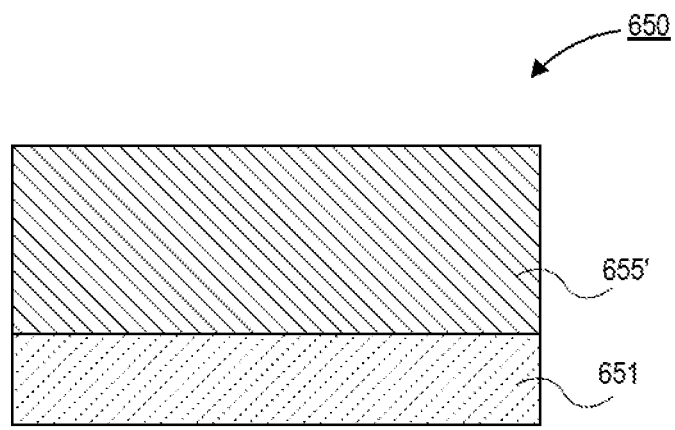

Referring now to FIG. 6D, a cross-sectional illustration of the diode 650 after the sacrificial layer 660 is removed is shown, in accordance with an embodiment. In an embodiment, the sacrificial layer 660 may be removed with an etching process, a polishing process, or the like. It is to be appreciated that region 660 can also remain, though there is the option to make it fully sacrificial in order to replace with a non-depleted electrode on top.

Figure 6E:
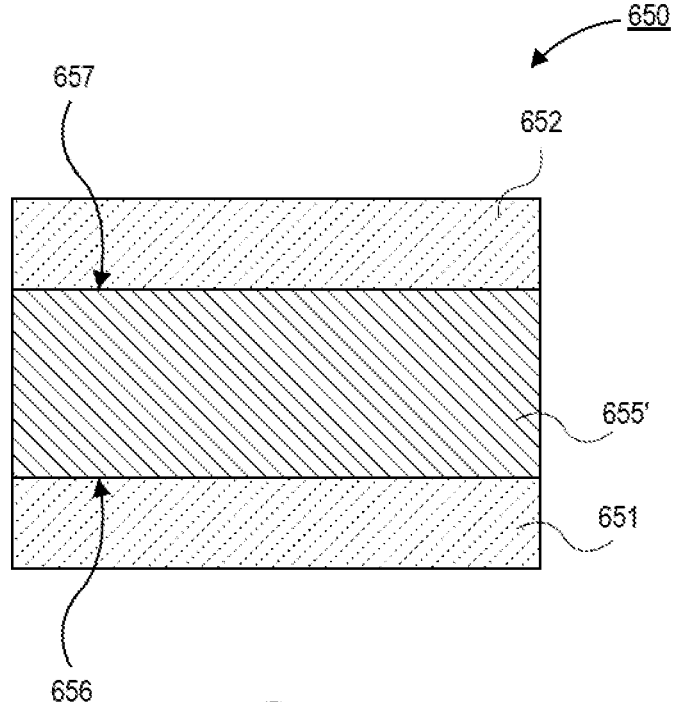

Referring now to FIG. 6E, a cross-sectional illustration of the diode 650 after a second electrode 652 is provided over the top surface of the doped semiconductor region 655' is shown, in accordance with an embodiment. In an embodiment, the compositional gradient of the doped semiconductor region 655' results in a first interface 656 with a Schottky contact, and a second interface 657 with an ohmic contact.

Figure 7:
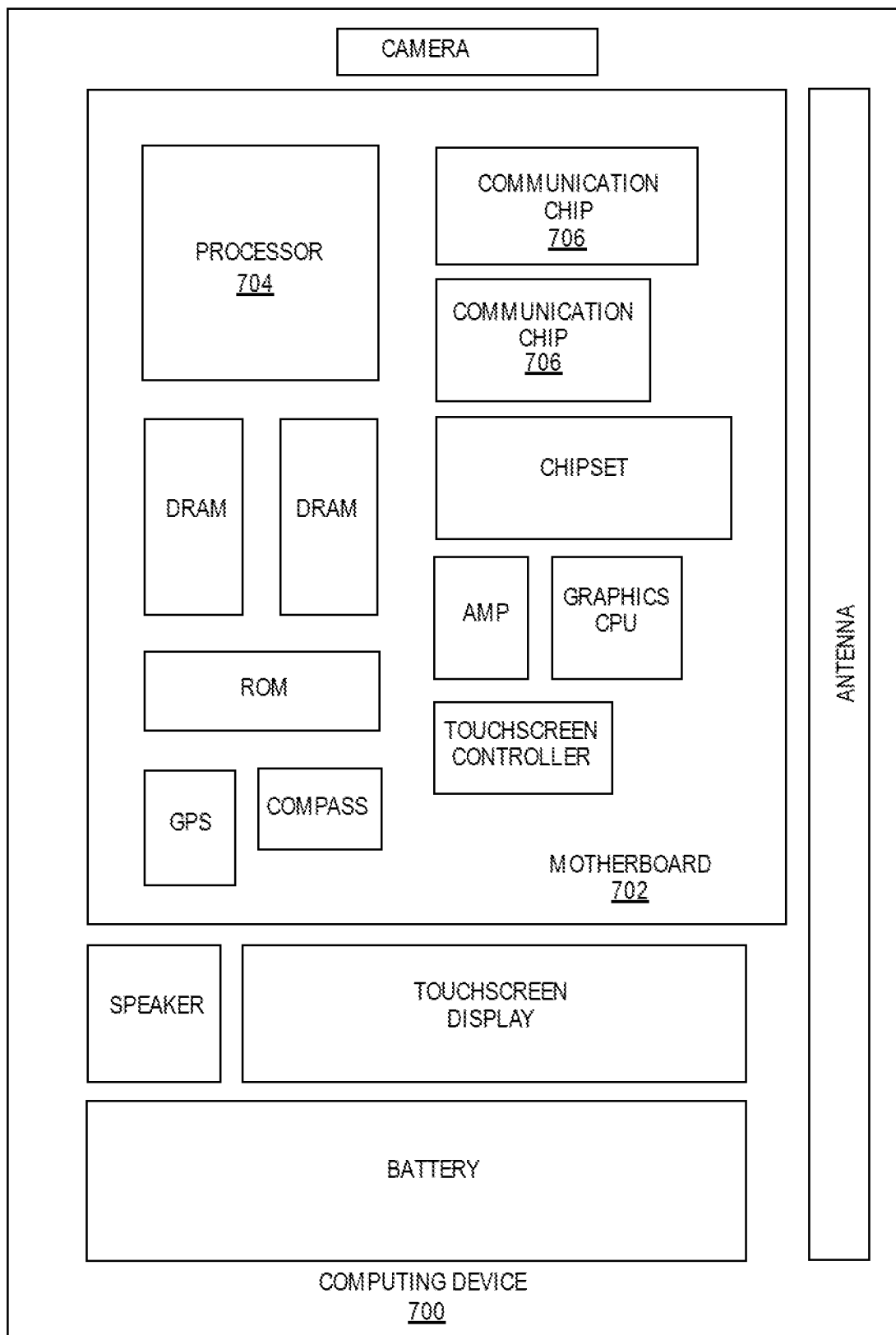
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor may comprise an ESD diode in the BEOL stack that is configured to provide ESD protection to one or more transistors on the semiconductor substrate, as described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip may comprise an ESD diode in the BEOL stack that is configured to provide ESD protection to one or more transistors on the semiconductor substrate, as described herein.

In further implementations, another component housed within the computing device 700 may comprise an ESD diode in the BEOL stack that is configured to provide ESD protection to one or more transistors on the semiconductor substrate, as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
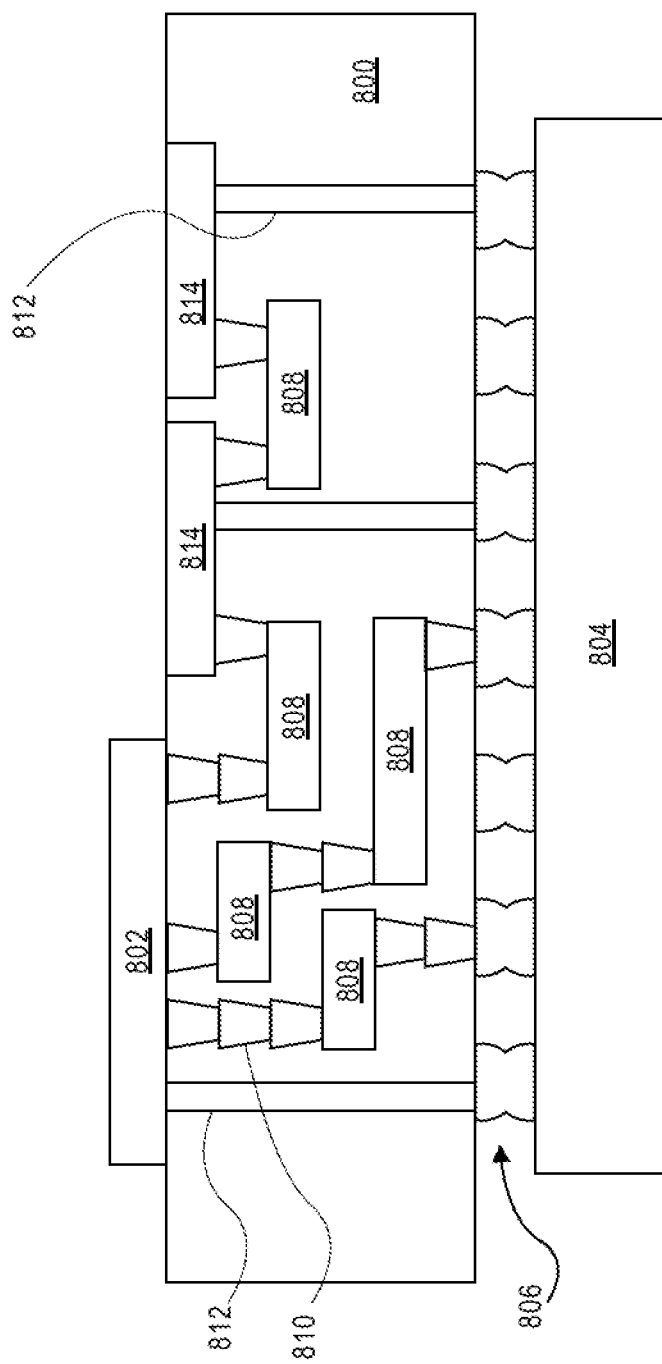
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. In an embodiment, both the first substrate 802 and the second substrate 804 may comprise an ESD diode in the BEOL stack that is configured to provide ESD protection to one or more transistors on the semiconductor substrate, in accordance with embodiments described herein. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure may comprise an ESD diode in the BEOL stack that is configured to provide ESD protection to one or more transistors on the semiconductor substrate.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a semiconductor substrate, wherein a transistor device is provided on the semiconductor substrate; a stack of routing layers over the semiconductor substrate; and a diode in the stack of routing layers, wherein the diode is configured to provide electrostatic discharge (ESD) protection to the transistor device.

Example 2: the semiconductor device of Example 1, wherein the transistor device is a non-planar transistor.

Example 3: the semiconductor device of Example 2, wherein the transistor device is a gate-all-around (GAA) transistor.

Example 4: the semiconductor device of Examples 1-3, wherein the diode comprises: a first electrode; a semiconductor region over the first electrode; and a second electrode over the semiconductor region.

Example 5: the semiconductor device of Example 4, wherein a first interface between the first electrode and the semiconductor region is a Schottky contact, and wherein a second interface between the second electrode and the semiconductor region is an ohmic contact.

Example 6: the semiconductor device of Example 4, wherein the semiconductor region comprises: a first layer with a first material composition; and a second layer with a second material composition that is different than the first material composition.

Example 7: the semiconductor device of Example 6, wherein the first layer comprises an insulating oxide material, and the second layer comprises a conducting oxide.

Example 8: the semiconductor device of Example 4, wherein the semiconductor region comprises: a layer with a compositional gradient through a thickness of the semiconductor region between the first electrode and the second electrode.

Example 9: the semiconductor device of Example 8, wherein the compositional gradient comprises an insulating oxide material at a first end and a conducting oxide at a second end.

Example 10: the semiconductor device of Examples 1-9, wherein the diode is a Schottky diode.

Example 11: a method of forming a semiconductor device with electrostatic discharge (ESD) protection, comprising: forming a non-planar transistor on a semiconductor layer; forming a stack of routing layers over the semiconductor layer; and forming a diode in the stack of routing layers, wherein the diode is configured to provide ESD protection to the non-planar transistor.

Example 12: the method of Example 11, wherein forming the diode comprises: forming a first electrode; forming a semiconductor region over the first electrode; and forming a second electrode over the semiconductor region, wherein a first interface between the semiconductor region and the first electrode is a Schottky contact, and wherein a second interface between the semiconductor region and the second electrode is an ohmic contact.

Example 13: the method of Example 12, wherein the semiconductor region comprises a compositional gradient between the first interface and the second interface.

Example 14: the method of Example 13, wherein the compositional gradient is formed using binary oxide targets in a physical vapor deposition process.

Example 15: the method of Example 13, wherein the compositional gradient is formed with a process comprising: implanting a surface of the semiconductor region with dopants; and annealing the semiconductor region to diffuse the dopants into the semiconductor region.

Example 16: the method of Example 13, wherein the compositional gradient is formed with a process comprising: forming a sacrificial layer over the semiconductor region; annealing the semiconductor region to drive diffusion of the sacrificial layer into the semiconductor region; and removing the sacrificial layer.

Example 17: the method of Examples 13-16, wherein the compositional gradient starts at the first interface with a first material composition comprising an insulating oxide material, and the compositional gradient ends at the second interface with a second material composition comprising a conductive oxide material.

Example 18: an electronic system, comprising: a board; a package substrate coupled to the board; and a die coupled to the package substrate, wherein the die comprises: a semiconductor substrate, wherein a transistor device is provided on the semiconductor substrate; a stack of routing layers over the semiconductor substrate; and a diode in the stack of routing layers, wherein the diode is configured to provide electrostatic discharge (ESD) protection to the transistor device.

Example 19: the electronic system of Example 18, wherein the diode comprises: a first electrode; a semiconductor region over the first electrode; and a second electrode over the semiconductor region.

Example 20: the electronic system of Example 19, wherein a first interface between the first electrode and the semiconductor region is a Schottky contact, and wherein a second interface between the second electrode and the semiconductor region is an ohmic contact.

What is claimed is:

1. A semiconductor device, comprising:
   a semiconductor substrate, wherein a transistor device is provided on the semiconductor substrate;
   a stack of routing layers over the semiconductor substrate; and
   a diode in the stack of routing layers, wherein the diode is configured to provide electrostatic discharge (ESD) protection to the transistor device; and wherein the diode comprises:
   a first electrode;
   a semiconductor region over the first electrode; and
   a second electrode over the semiconductor region.

2. The semiconductor device of claim 1, wherein the transistor device is a non-planar transistor.

3. The semiconductor device of claim 2, wherein the transistor device is a gate-all-around (GAA) transistor.

4. The semiconductor device of claim 1, wherein a first interface between the first electrode and the semiconductor region is a Schottky contact, and wherein a second interface between the second electrode and the semiconductor region is an ohmic contact.

5. The semiconductor device of claim 1, wherein the semiconductor region comprises:
   a first layer with a first material composition; and
   a second layer with a second material composition that is different than the first material composition.

6. The semiconductor device of claim 5, wherein the first layer comprises an insulating oxide material, and the second layer comprises a conducting oxide.

7. The semiconductor device of claim 1, wherein the semiconductor region comprises:
   a layer with a compositional gradient through a thickness of the semiconductor region between the first electrode and the second electrode.

8. The semiconductor device of claim 7, wherein the compositional gradient comprises an insulating oxide material at a first end and a conducting oxide at a second end.

9. The semiconductor device of claim 1, wherein the diode is a Schottky diode.

10. A method of forming a semiconductor device with electrostatic discharge (ESD) protection, comprising:
    forming a non-planar transistor on a semiconductor layer;
    forming a stack of routing layers over the semiconductor layer; and
    forming a diode in the stack of routing layers, wherein the diode is configured to provide ESD protection to the non-planar transistor, and wherein forming the diode comprises:
    forming a first electrode;
    forming a semiconductor region over the first electrode; and
    forming a second electrode over the semiconductor region, wherein a first interface between the semiconductor region and the first electrode is a Schottky contact, and wherein a second interface between the semiconductor region and the second electrode is an ohmic contact.

11. The method of claim 10, wherein the semiconductor region comprises a compositional gradient between the first interface and the second interface.

12. The method of claim 11, wherein the compositional gradient is formed using binary oxide targets in a physical vapor deposition process.

13. The method of claim 11, wherein the compositional gradient is formed with a process comprising:
    implanting a surface of the semiconductor region with dopants; and
    annealing the semiconductor region to diffuse the dopants into the semiconductor region.

14. The method of claim 11, wherein the compositional gradient is formed with a process comprising:
    forming a sacrificial layer over the semiconductor region;
    annealing the semiconductor region to drive diffusion of the sacrificial layer into the semiconductor region; and
    removing the sacrificial layer.

15. The method of claim 11, wherein the compositional gradient starts at the first interface with a first material composition comprising an insulating oxide material, and the compositional gradient ends at the second interface with a second material composition comprising a conductive oxide material.

16. An electronic system, comprising:
    a board;
    a package substrate coupled to the board; and
    a die coupled to the package substrate, wherein the die comprises:
        a semiconductor substrate, wherein a transistor device is provided on the semiconductor substrate;
        a stack of routing layers over the semiconductor substrate; and
        a diode in the stack of routing layers, wherein the diode is configured to provide electrostatic discharge (ESD) protection to the transistor device, wherein the diode comprises:
            a first electrode;
            a semiconductor region over the first electrode; and
            a second electrode over the semiconductor region.

17. The electronic system of claim 16, wherein a first interface between the first electrode and the semiconductor region is a Schottky contact, and wherein a second interface between the second electrode and the semiconductor region is an ohmic contact.

* * * * *